(12) United States Patent
Kanaoka

(10) Patent No.: US 8,941,809 B2
(45) Date of Patent: Jan. 27, 2015

(54) SUBSTRATE PROCESSING APPARATUS AND SUBSTRATE PROCESSING METHOD

(75) Inventor: Masashi Kanaoka, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 764 days.

(21) Appl. No.: 12/644,700

(22) Filed: Dec. 22, 2009

(65) Prior Publication Data

US 2010/0159372 A1 Jun. 24, 2010

(30) Foreign Application Priority Data

Dec. 22, 2008 (JP) ................................. 2008-324938
Dec. 22, 2008 (JP) ................................. 2008-324939

(51) Int. Cl.
 *G03B 27/42* (2006.01)
 *H01L 21/67* (2006.01)
(52) U.S. Cl.
 CPC .............................. *H01L 21/67288* (2013.01)
 USPC .................... 355/53; 355/30; 355/72; 355/77
(58) Field of Classification Search
 CPC ................... H01L 21/67288; H01L 21/67173; H01L 21/67184; H01L 21/67178; H01L 21/67253; H01L 21/6715; G03F 7/70608; G03F 7/70341; G03F 7/162; G03F 7/3021
 USPC .................................. 355/30, 53, 72; 430/30
 See application file for complete search history.

(56) References Cited

U.S. PATENT DOCUMENTS

| | | | |
|---|---|---|---|
| 2003/0213431 A1 | 11/2003 | Fukutomi et al. | |
| 2004/0170313 A1* | 9/2004 | Nakano et al. | 382/145 |
| 2004/0207836 A1* | 10/2004 | Chhibber et al. | 356/237.4 |
| 2005/0061247 A1* | 3/2005 | Shibata et al. | 118/719 |
| 2005/0271382 A1* | 12/2005 | Ogata et al. | 396/611 |
| 2006/0007419 A1 | 1/2006 | Streefkerk et al. | |
| 2006/0104635 A1 | 5/2006 | Kaneyama et al. | |
| 2007/0190437 A1* | 8/2007 | Kaneyama et al. | 430/30 |
| 2007/0229789 A1 | 10/2007 | Kawamura | |
| 2009/0027634 A1 | 1/2009 | Nishimura et al. | |
| 2009/0033890 A1* | 2/2009 | Fujiwara et al. | 355/30 |
| 2009/0079949 A1 | 3/2009 | Streefkerk et al. | |

(Continued)

FOREIGN PATENT DOCUMENTS

| | | |
|---|---|---|
| JP | 2002-195956 | 7/2002 |
| JP | 2003-324139 | 11/2003 |

(Continued)

OTHER PUBLICATIONS

Japanese Office Action in counterpart Japanese Application No. 2008-324939 dated Sep. 25, 2012.

(Continued)

*Primary Examiner* — Mesfin T Asfaw
(74) *Attorney, Agent, or Firm* — Ostrolenk Faber LLP

(57) ABSTRACT

A substrate processing apparatus includes an indexer block, an anti-reflection film processing block, a resist film processing block, a development processing block, a resist cover film processing block, a resist cover film removal block, and an interface block. An exposure device is arranged adjacent to the interface block. The interface block includes first and second inspection units. The first inspection unit inspects the state of the substrate before exposure processing, and the second inspection unit inspects the state of the substrate after exposure processing.

22 Claims, 7 Drawing Sheets

(56) References Cited

U.S. PATENT DOCUMENTS

| | | | |
|---|---|---|---|
| 2010/0073647 | A1 | 3/2010 | Kyouda et al. |
| 2013/0135595 | A1 | 5/2013 | Streefkerk et al. |

FOREIGN PATENT DOCUMENTS

| | | |
|---|---|---|
| JP | 2006-24939 | 1/2006 |
| JP | 2006-140283 | 6/2006 |
| JP | 2006-165192 | 6/2006 |
| JP | 2006-319217 | 11/2006 |
| JP | 2007-266074 | 10/2007 |
| JP | 2007-273792 | 10/2007 |
| JP | 2007-311734 | 11/2007 |
| JP | 2008-135582 | 6/2008 |
| JP | 2009-032886 | 2/2009 |
| JP | 2009-032887 | 2/2009 |
| WO | 99/49504 | 9/1999 |

OTHER PUBLICATIONS

Japanese Office Action in counterpart Japanese Application No. 2008-324938 dated Sep. 25, 2012.

Japanese Decision to Grant a Patent dated Aug. 20, 2013 in the corresponding Japanese Application No. 2008-324938 (3 pages).

Decision of Refusal dated May 27, 2014 in the counterpart Japanese Application No. 2008-324939 (3 pages).

\* cited by examiner

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for subjecting substrates to processing.

2. Description of the Background Art

Substrate processing apparatuses are used to subject various types of substrates such as semiconductor substrates, substrates for liquid crystal devices, plasma displays, optical disks, magnetic disks, and magneto-optical disks, photomasks, and other substrates to various types of processing.

Such a substrate processing apparatus generally subjects a single substrate to a plurality of different types of processing successively. A substrate processing apparatus as described in JP 2003-324139 A includes an indexer block, an anti-reflection film processing block, a resist film processing block, a development processing block, and an interface block. An exposure device is arranged adjacent to the interface block as an external device separate from the substrate processing apparatus.

In the above-mentioned substrate processing apparatus, a substrate carried thereinto from the indexer block is transported to the exposure device through the interface block after being subjected to anti-reflection film formation and resist film coating processing in the anti-reflection film processing block and the resist film processing block. After the resist film on the substrate is subjected to exposure processing in the exposure device, the substrate is transported to the development processing block through the interface block. After the resist film on the substrate is subjected to development processing to form a resist pattern thereon in the development processing block, the substrate is transported to the indexer block.

With recent increases in density and integration of devices, making finer resist patterns has become an important problem. Therefore, as projection exposure methods allowing for finer exposure patterns, a liquid immersion method has been suggested (see, e.g., WO99/49504 pamphlet). In the projection exposure device according to the WO99/49504 pamphlet, an area between a projection optical system (exposure lens) and a substrate is filled with a liquid, resulting in a shorter wavelength of exposure light on a top surface of the substrate. This allows for a finer exposure pattern.

When exposure processing is performed using the liquid immersion method, if the liquid supplied onto the substrate directly comes into contact with a resist film, a component of the resist film is eluted in the liquid. Thus, the exposure lens is contaminated, resulting in processing defects occurring in the substrate. Furthermore, if the exposure lens is damaged, an excessive cost is required to restore the exposure lens. Therefore, it has been proposed that a resist cover film is formed to cover the resist film (see, e.g., JP 2006-140283 A).

Before the substrate is conveyed to an exposure device, however, a portion of the resist cover film may be stripped from the substrate. In this case, during exposure processing in the exposure device, a component of the resist film or the like is eluted from the stripped portion of the resist cover film, causing the exposure lens to be contaminated.

A portion of the resist cover film may be stripped from the substrate within the exposure device. In this case, the component of the resist film or the like is also eluted from the stripped portion of the resist cover film, causing the exposure lens to be contaminated.

SUMMARY OF THE INVENTION

An object of the present invention is to provide a substrate processing apparatus and a substrate processing method that prevent the inside of an exposure device from being contaminated.

Another object of the present invention is to provide a substrate processing apparatus and a substrate processing method that enable an exposure device to be maintained quickly at proper timing.

(1) According to an aspect of the present invention, a substrate processing apparatus arranged adjacent to an exposure device that subjects a substrate to exposure processing using a liquid immersion method includes a processing section that subjects the substrate to processing, an interface provided adjacent to one end of the processing section for transferring and receiving the substrate between the processing section and the exposure device, and a controller that controls the operations of the processing section and the interface, in which the processing section includes a film formation unit that forms a first film on the substrate, and a thermal processing unit that subjects the first film formed by the film formation unit to thermal processing, the interface includes a first inspection unit that inspects the state of the substrate after the thermal processing by the thermal processing unit and before the exposure processing by the exposure device, and the controller determines whether or not the state of the substrate is normal based on the result of the inspection by the first inspection unit, and controls the interface to transport the substrate that is normal in the state to the exposure device and not to transport the substrate that is not normal in the state to the exposure device.

In the substrate processing apparatus, in the processing section, the film formation unit forms the first film on the substrate, and the thermal processing unit then subjects the first film to the thermal processing. After the thermal processing by the thermal processing unit, the first inspection unit in the interface inspects the state of the substrate. The substrate that is normal in the inspection by the first inspection unit is transported from the interface to the exposure device. In the exposure device, the substrate is subjected to the exposure processing with the liquid brought into contact with the first film. On the other hand, the substrate that is not normal in the inspection by the first inspection unit is not transported from the interface to the exposure device.

In this case, if the substrate is abnormal, the exposure processing cannot be stably performed. Thus, the inside of the exposure device is contaminated. Therefore, the abnormal substrate is not transported to the exposure device, which can prevent the contamination in the exposure device in advance.

(2) The first inspection unit may include an appearance inspection device that inspects the appearance of the first film formed by the film formation unit, and the controller may determine that the state of the substrate is not normal when the appearance of the first film is abnormal in the inspection by the appearance inspection device.

In this case, the substrate in which a portion of the first film is stripped or the substrate in which the first film is contaminated is not transported to the exposure device. This prevents the inside of the exposure device from being contaminated due to the stripping or the contamination of the first film.

(3) The first inspection unit may include a bevel portion inspection device that inspects a bevel portion in the substrate, and the controller may determine that the state of the substrate is not normal when the bevel portion in the substrate is abnormal in the inspection by the bevel portion inspection device.

In this case, the substrate in which the bevel portion is contaminated is not transported to the exposure device. This prevents the inside of the exposure device from being contaminated due to the contamination of the bevel portion in the substrate.

(4) The first inspection unit may include a component inspection device that inspects a component of the first film formed by the film formation unit, and the controller may determine that the state of the substrate is not normal when the component of the first film is abnormal in the inspection by the component inspection device.

In this case, the substrate in which the component of the first film is not proper is not transported to the exposure device. This prevents the liquid supplied during the exposure processing from flowing out to the periphery of the substrate and prevents the inside of the exposure device from being contaminated by the component of the first film eluted in the liquid.

(5) The first inspection unit may include a contact angle inspection device that inspects the contact angle of a liquid on the first film formed by the film formation unit, and the controller may determine that the state of the substrate is not normal when the contact angle of the liquid on the first film is abnormal in the inspection by the contact angle inspection device.

In this case, the substrate in which the contact angle of the liquid on the first film is abnormal is not transported to the exposure device. This prevents the liquid supplied during the exposure processing from flowing out to the periphery of the substrate.

(6) The first inspection unit may include a film thickness inspection device that inspects the film thickness of the first film formed by the film formation unit, and the controller may determine that the state of the substrate is not normal when the film thickness of the first film is abnormal in the inspection by the film thickness inspection device.

In this case, the substrate in which the film thickness of the first film is abnormal is not transported to the exposure device. This prevents the first film from being stripped from the substrate during the exposure processing.

(7) One of the processing section and the interface may further include a cleaning processing unit that performs cleaning processing of the substrate after the thermal processing by the thermal processing unit and before the exposure processing by the exposure device, and the first inspection unit may inspect the state of the substrate after the cleaning processing by the cleaning processing unit.

In this case, when the substrate is subjected to the cleaning processing using the liquid such as a cleaning liquid or a rinse liquid in the cleaning processing unit, the first film is easily stripped during the processing. Therefore, the state of the substrate after the cleaning processing is inspected so that the stripping of the first film during the cleaning processing can be reliably detected.

(8) The interface may further include a second inspection unit that inspects the state of the substrate after the exposure processing by the exposure device.

In this case, the change in the state of the substrate before and after the exposure processing can be detected based on the results of the inspection by the first and second inspection units. This enables, when an abnormality has occurred in the substrate within the exposure device, quick recognition of the occurrence of the abnormality. Therefore, the exposure device can be quickly maintained after the abnormality occurs within the exposure device. As a result, contamination in and damage to the exposure device can be minimized.

(9) The film formation unit may form a photosensitive film composed of a photosensitive material as the first film on the substrate.

In this case, in the exposure device, the substrate is subjected to the exposure processing with the liquid brought into contact with the photosensitive film. Therefore, another film is not formed on the photosensitive film. This enables the substrate to be quickly processed in a simple configuration.

(10) The film formation unit may form a photosensitive film composed of a photosensitive material as a second film on the substrate, and forms a protective film for protecting the photosensitive film as the first film.

In this case, in the exposure device, the substrate is subjected to the exposure processing with the liquid brought into contact with the protective film. Therefore, the photosensitive film and the protective film are prevented from coming into contact with each other. This can prevent contamination in the exposure device even when the photosensitive film is easily eluted in the liquid.

(11) According to another aspect of the present invention, a substrate processing apparatus arranged adjacent to an exposure device that subjects a substrate to exposure processing using a liquid immersion method includes a processing section that subjects the substrate to processing, and an interface provided adjacent to one end of the processing section for transferring and receiving the substrate between the processing section and the exposure device, in which the processing section includes a film formation unit that forms a first film on the substrate, the interface includes a first inspection unit that inspects the state of the substrate after the formation of the first film by the film formation unit and before the exposure processing by the exposure device, and a second inspection unit that inspects the state of the substrate after the exposure processing by the exposure device.

In the substrate processing apparatus, the film formation unit in the processing section forms the first film on the substrate, and the first inspection unit in the interface then inspects the state of the substrate. After the inspection by the first inspection unit, the substrate is transported from the interface to the exposure device. In the exposure device, the substrate is subjected to the exposure processing with the liquid brought into contact with the first film. After the exposure processing, the substrate is transported from the exposure device to the interface. The second inspection unit in the interface inspects the state of the substrate.

In this case, the change in the state of the substrate before and after the exposure processing can be detected based on the results of the inspection by the first and second inspection units. This enables, when an abnormality has occurred in the substrate within the exposure device, quick recognition of the occurrence of the abnormality. Therefore, the exposure device can be quickly maintained after the abnormality occurs within the exposure device. As a result, contamination in and damage to the exposure device can be minimized.

(12) Each of the first and second inspection units may include an appearance inspection device that inspects the appearance of the first film formed by the film formation unit.

In this case, the change in the appearance of the first film before and after the exposure processing enables quick recognition that an abnormality has occurred in the first film within the exposure device. Thus, the exposure device is quickly maintained so that contamination in and damage to the exposure device can be minimized.

(13) Each of the first and second inspection units may include a bevel portion inspection device that inspects a bevel portion in the substrate.

In this case, the change in the state of the bevel portion in the substrate before and after the exposure processing enables quick recognition that an abnormality has occurred in the bevel portion in the substrate within the exposure device. Thus, the exposure device is quickly maintained so that contamination in and damage to the exposure device can be minimized.

(14) Each of the first and second inspection units may include a component inspection device that inspects a component of the first film formed by the film formation unit.

In this case, the change in the component of the first film before and after the exposure processing enables quick recognition that an abnormality has occurred in the first film within the exposure device. Thus, the exposure device is quickly maintained so that contamination in and damage to the exposure device can be minimized.

(15) Each of the first and second inspection units may include a contact angle inspection device that inspects the contact angle of a liquid on the first film formed by the film formation unit.

In this case, the change in the contact angle of the liquid on the first film before and after the exposure processing enables quick recognition that an abnormality has occurred in the first film within the exposure device. Thus, the exposure device is quickly maintained so that contamination in and damage to the exposure device can be minimized.

(16) Each of the first and second inspection units may include a film thickness inspection device that inspects the film thickness of the first film formed by the film formation unit.

In this case, the change in the film thickness of the first film before and after the exposure processing enables quick recognition that an abnormality has occurred in the first film within the exposure device. Thus, the exposure device is quickly maintained so that contamination in and damage to the exposure device can be minimized.

(17) The substrate processing apparatus may further include an alarm device that generates an alarm to an operator when the result of the inspection in the first inspection unit and the result of the inspection in the second inspection unit differ from each other.

In this case, the operator is enabled to quickly and reliably recognize that an abnormality has occurred in the substrate within the exposure device. Thus, the exposure device can be quickly maintained when the abnormality has occurred within the exposure device. As a result, contamination in and damage to the exposure device can be minimized.

(18) The interface need not transport the substrate that is abnormal in the inspection by the first inspection unit to the exposure device.

In this case, when the substrate is abnormal, the exposure processing cannot be normally performed. Thus, the inside of the exposure device is contaminated. Therefore, the abnormal substrate is not transported to the exposure device, which can prevent the contamination in the exposure device in advance.

(19) The film formation unit may form a photosensitive film composed of a photosensitive material as the first film on the substrate.

In this case, in the exposure device, the substrate is subjected to the exposure processing with the liquid brought into contact with the photosensitive film. Therefore, another film is not formed on the photosensitive film. This enables the substrate to be quickly processed in a simple configuration.

(20) The film formation unit may form a photosensitive film composed of a photosensitive material as a second film on the substrate, and forms a protective film for protecting the photosensitive film as the first film.

In this case, in the exposure device, the substrate is subjected to the exposure processing with the liquid brought into contact with the protective film. Therefore, the photosensitive film and the protective film are prevented from coming into contact with each other. This can prevent contamination in the exposure device even when the photosensitive film is easily eluted in the liquid.

(21) According to still another aspect of the present invention, a substrate processing method for processing a substrate in a substrate processing apparatus arranged adjacent to an exposure device that subjects the substrate to exposure processing using a liquid immersion method and including a processing section and an interface includes the steps of forming a first film on the substrate in the processing section, subjecting the first film to thermal processing in the processing section, inspecting the state of the substrate in the interface after the thermal processing of the first film and before the exposure processing by the exposure device, determining whether or not the state of the substrate is normal based on the results of the inspection, transporting the substrate that is determined to be normal in the state to the exposure device by the interface, and not transporting the substrate that is determined not to be normal in the state to the exposure device by the interface.

In the substrate processing method, the first film is formed on the substrate and is then subjected to the thermal processing in the processing section. After the thermal processing, the state of the substrate is inspected in the interface. The substrate that is normal in the state in the inspection is transported from the interface to the exposure device. In the exposure device, the substrate is subjected to the exposure processing with the liquid brought into contact with the first film. On the other hand, the substrate that is not normal in the state in the inspection is not transported from the interface to the exposure device.

In this case, if the substrate is abnormal, the exposure processing cannot be stably performed. Thus, the inside of the exposure device is contaminated. Therefore, the abnormal substrate is not transported to the exposure device, which can prevent the contamination in the exposure device in advance.

(22) According to a further aspect of the present invention, a substrate processing method for processing a substrate in a substrate processing apparatus arranged adjacent to an exposure device that subjects the substrate to exposure processing using a liquid immersion method and including a processing section and an interface includes the steps of forming a first film on the substrate in the processing section, inspecting the state of the substrate in the interface after the formation of the first film and before the exposure processing by the exposure device, and inspecting the state of the substrate after the exposure processing by the exposure device.

In the substrate processing method, the first film is formed on the substrate in the processing section, and the state of the substrate is inspected in the interface. After the inspection, the substrate is transported from the interface to the exposure device. In the exposure device, the substrate is subjected to the exposure processing with the liquid brought into contact with the first film. After the exposure processing, the substrate is transported from the exposure device to the interface, and the state of the substrate is inspected in the interface.

In this case, the change in the state of the substrate before and after the exposure processing can be detected. This enables, when an abnormality has occurred in the substrate within the exposure device, quick recognition of the occurrence of the abnormality. Therefore, the exposure device can be quickly maintained after the abnormality occurs within the exposure device. As a result, contamination in and damage to the exposure device can be minimized.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus according to an embodiment of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

(1) Configuration of Substrate Processing Apparatus

Figure 1:
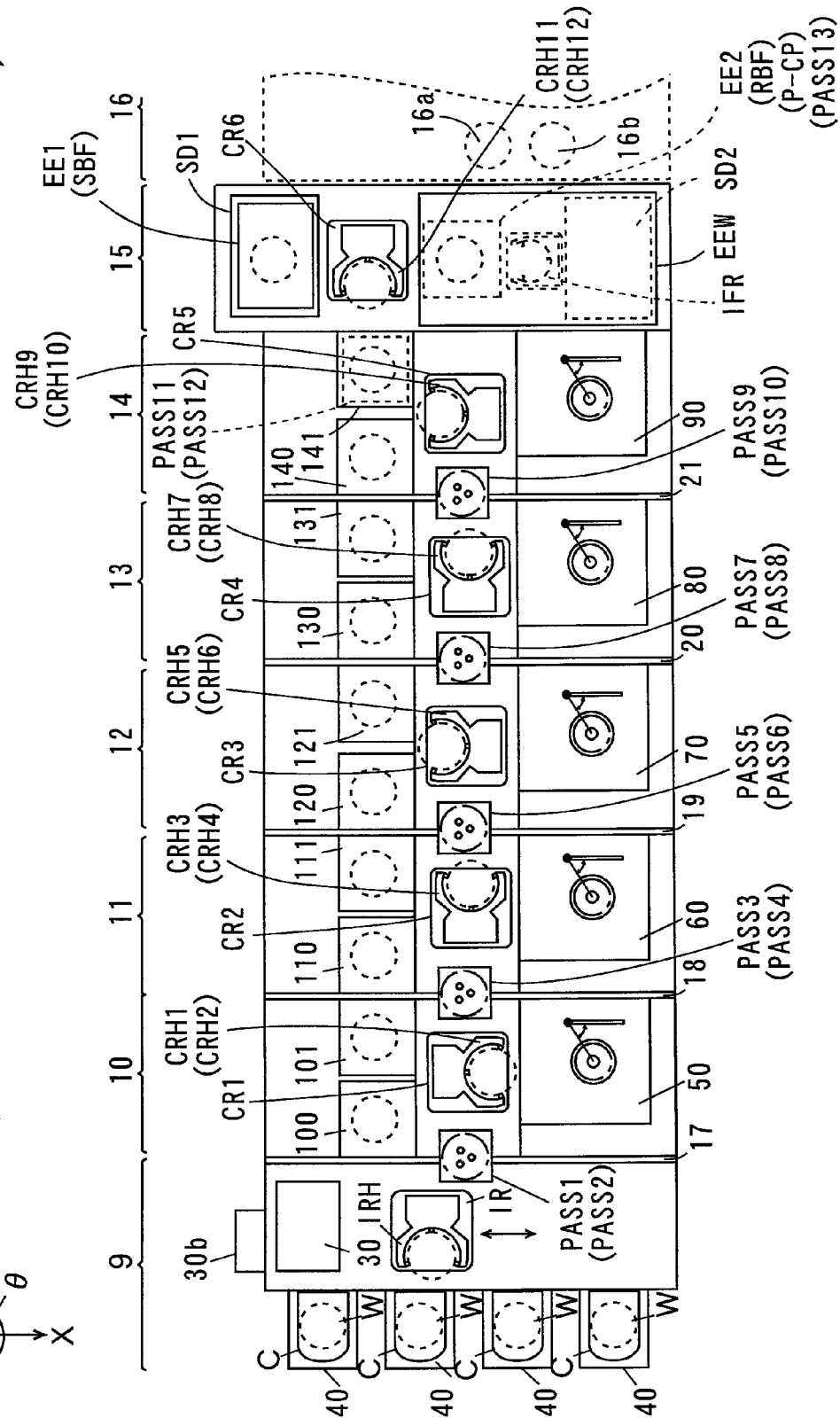
FIG. 1 is a plan view of a substrate processing apparatus according to a first embodiment of the present invention.

FIG. 1 is a plan view of a substrate processing apparatus according to a first embodiment of the present invention. FIG. 1 and FIGS. 2 to 4 described below are accompanied by arrows that respectively indicate X, Y, and Z directions perpendicular to one another for clarity of a positional relationship. The X and Y directions are perpendicular to each other within a horizontal plane, and the Z direction corresponds to a vertical direction. In each of the directions, the direction of the arrow is defined as a + direction, and the opposite direction is defined as a − direction. A rotation direction centered around the Z direction is defined as a θ direction.

As illustrated in FIG. 1, a substrate processing apparatus 500 includes an indexer block 9, an anti-reflection film processing block 10, a resist film processing block 11, a development processing block 12, a resist cover film processing block 13, a resist cover film removal block 14, and an interface block 15. An exposure device 16 is arranged adjacent to the interface block 15. The exposure device 16 subjects a substrate W to exposure processing by means of a liquid immersion method.

Each of the indexer block 9, the anti-reflection film processing block 10, the resist film processing block 11, the development processing block 12, the resist cover film processing block 13, the resist cover film removal block 14, and the interface block 15 will be hereafter referred to as a processing block.

The indexer block 9 includes a main controller (controller) 30 that controls the operation of each of the processing blocks, an alarm device 30b, a plurality of carrier platforms 40, and an indexer robot IR. The indexer robot IR has a hand IRH provided for receiving and transferring the substrates W.

The anti-reflection film processing block 10 includes thermal processing groups 100 and 101 for anti-reflection film, a coating processing group 50 for anti-reflection film, and a first central robot CR1. The coating processing group 50 is opposed to the thermal processing groups 100 and 101 with the first central robot CR1 sandwiched therebetween. The first central robot CR1 has hands CRH1 and CRH2 provided one above the other for receiving and transferring the substrates W.

A partition wall 17 is provided between the indexer block 9 and the anti-reflection film processing block 10 for shielding an atmosphere. The partition wall 17 has substrate platforms PASS1 and PASS2 provided in close proximity one above the other for receiving and transferring the substrates W between the indexer block 9 and the anti-reflection film processing block 10. The upper substrate platform PASS1 is used in transporting the substrates W from the indexer block 9 to the anti-reflection film processing block 10, and the lower substrate platform PASS2 is used in transporting the substrates W from the anti-reflection film processing block 10 to the indexer block 9.

Each of the substrate platforms PASS1 and PASS2 is provided with an optical sensor (not illustrated) for detecting the presence or absence of the substrate W. This enables determination whether or not the substrate W is placed on the substrate platform PASS1 or PASS2. Each of the substrate platforms PASS1 and PASS2 has a plurality of support pins secured thereto. Each of substrate platforms PASS3 to PASS13 described below is similarly provided with an optical sensor and support pins.

The resist film processing block 11 includes thermal processing groups 110 and 111 for resist film, a coating processing group 60 for resist film, and a second central robot CR2. The coating processing group 60 is opposed to the thermal processing groups 110 and 111 with the second central robot CR2 sandwiched therebetween. The second central robot CR2 has hands CRH3 and CRH4 provided one above the other for receiving and transferring the substrates W.

A partition wall 18 is provided between the anti-reflection film processing block 10 and the resist film processing block 11 for shielding an atmosphere. The partition wall 18 has substrate platforms PASS3 and PASS4 provided in close proximity one above the other for receiving and transferring the substrates W between the anti-reflection film processing block 10 and the resist film processing block 11. The upper substrate platform PASS3 is used in transporting the substrates W from the anti-reflection film processing block 10 to the resist film processing block 11, and the lower substrate platform PASS4 is used in transporting the substrates W from the resist film processing block 11 to the anti-reflection film processing block 10.

The development processing block 12 includes thermal processing groups 120 and 121 for development, a development processing group 70, and a third central robot CR3. The development processing group 70 is opposed to the thermal processing groups 120 and 121 with the third central robot CR3 sandwiched therebetween. The third central robot CR3 has hands CRH5 and CRH6 provided one above the other for receiving and transferring the substrates W.

A partition wall 19 is provided between the resist film processing block 11 and the development processing block 12 for shielding an atmosphere. The partition wall 19 has substrate platforms PASS5 and PASS6 provided in close proximity one above the other for receiving and transferring the substrates W between the resist film processing block 11 and the development processing block 12. The upper substrate platform PASS5 is used in transporting the substrates W from the resist film processing block 11 to the development processing block 12, and the lower substrate platform PASS6 is used in transporting the substrates W from the development processing block 12 to the resist film processing block 11.

The resist cover film processing block 13 includes thermal processing groups 130 and 131 for resist cover film, a coating processing group 80 for resist cover film, and a fourth central robot CR4. The coating processing group 80 is opposed to the thermal processing groups 130 and 131 with the fourth central robot CR4 sandwiched therebetween. The fourth central robot CR4 has hands CRH7 and CRH8 provided one above the other for receiving and transferring the substrates W.

A partition wall 20 is provided between the development processing block 12 and the resist cover film processing block 13 for shielding an atmosphere. The partition wall 20 has substrate platforms PASS7 and PASS8 provided in close proximity one above the other for receiving and transferring the substrates W between the development processing block 12 and the resist cover film processing block 13. The upper substrate platform PASS7 is used in transporting the substrates W from the development processing block 12 to the resist cover film processing block 13, and the lower substrate platform PASS8 is used in transporting the substrates W from the resist cover film processing block 13 to the development processing block 12.

The resist cover film removal block 14 includes thermal processing groups 140 and 141 for post-exposure bake, a removal processing group 90 for resist cover film, and a fifth central robot CR5. The thermal processing group 141 is adjacent to the interface block 15, and includes substrate platforms PASS11 and PASS12, as described below. The removal processing group 90 is opposed to the thermal processing groups 140 and 141 with the fifth central robot CR5 sandwiched therebetween. The fifth central robot CR5 has hands CRH9 and CRH10 provided one above the other for receiving and transferring the substrates W.

A partition wall 21 is provided between the resist cover film processing block 13 and the resist cover film removal block 14 for shielding an atmosphere. The partition wall 21 has substrate platforms PASS9 and PASS10 provided in close proximity one above the other for receiving and transferring the substrates W between the resist cover film processing block 13 and the resist cover film removal block 14. The upper substrate platform PASS9 is used in transporting the substrates W from the resist cover film processing block 13 to the resist cover film removal block 14, and the lower substrate platform PASS10 is used in transporting the substrates W from the resist cover film removal block 14 to the resist cover film processing block 13.

The interface block 15 includes a first inspection unit EE1, a sending buffer unit SBF, a first cleaning/drying processing unit SD1, a sixth central robot CR6, an edge exposure unit EEW, a second inspection unit EE2, a return buffer unit RBF, placement/cooling units PASS-CP (hereinafter abbreviated as P-CP), a substrate platform PASS13, an interface transport mechanism IFR, and a second cleaning/drying processing unit SD2.

The first cleaning/drying processing unit SD1 subjects the substrate W before exposure processing to cleaning and drying processing, and the second cleaning/drying processing unit SD2 subjects the substrate W after exposure processing to cleaning and drying processing. The first inspection unit EE1 inspects the state of the substrate W before exposure processing, and the second inspection unit EE2 inspects the state of the substrate W after exposure processing. The details of the first and second inspection units EE1 and EE2 will be described below.

The sixth central robot CR6 has hands CRH11 and CRH12 (see FIG. 4) provided one above the other for receiving and transferring the substrates W, and the interface transport mechanism IFR has hands H1 and H2 (see FIG. 4) provided one above the other for receiving and transferring the substrates W. The details of the interface block 15 will be described below.

In the substrate processing apparatus 500 according to the present embodiment, the indexer block 9, the anti-reflection film processing block 10, the resist film processing block 11, the development processing block 12, the resist cover film processing block 13, the resist cover film removal block 14, and the interface block 15 are provided side by side in this order in the Y direction.

Figure 2:
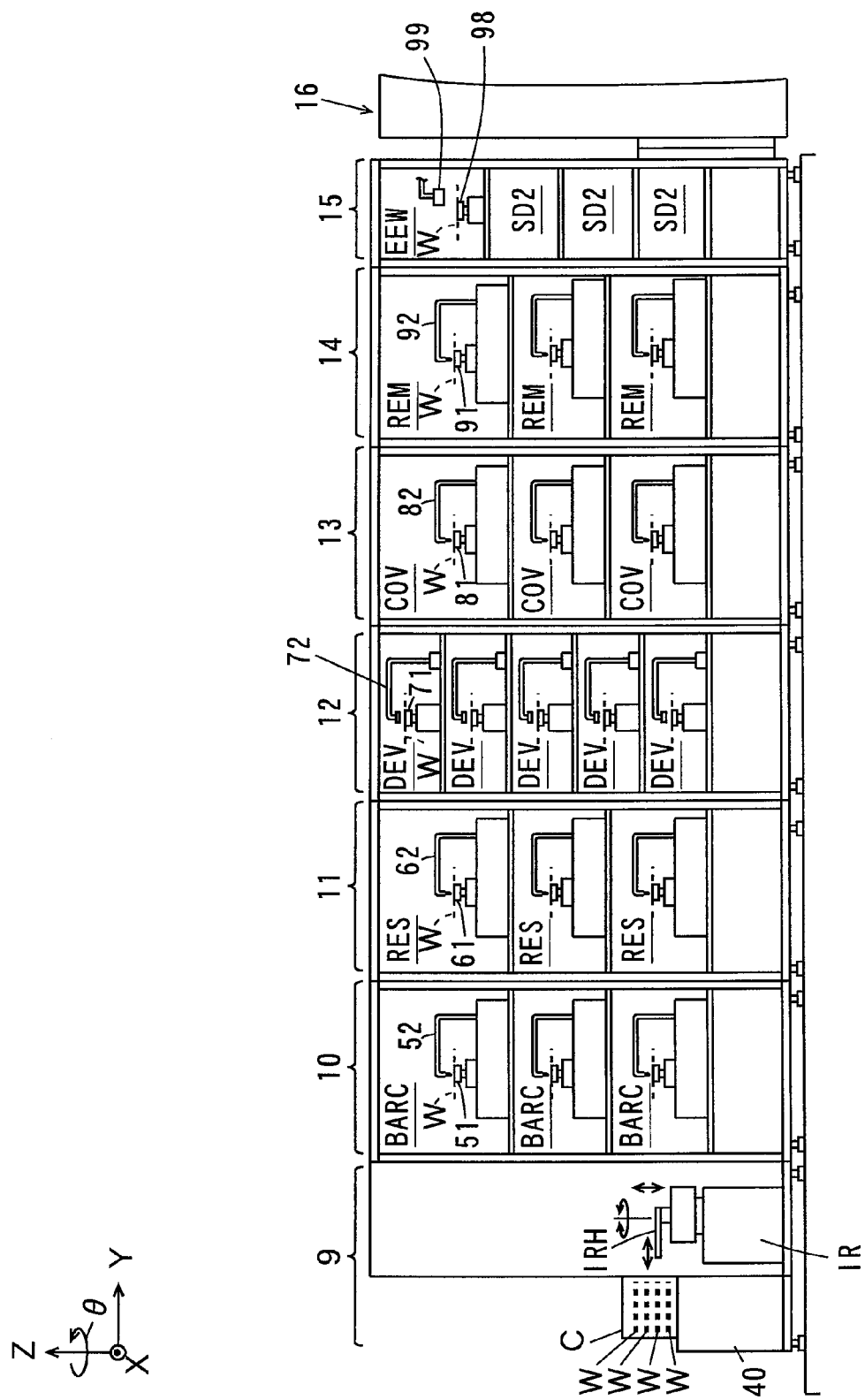
FIG. 2 is a schematic side view of the substrate processing apparatus illustrated in FIG. 1 as viewed from the +X direction.
Figure 3:
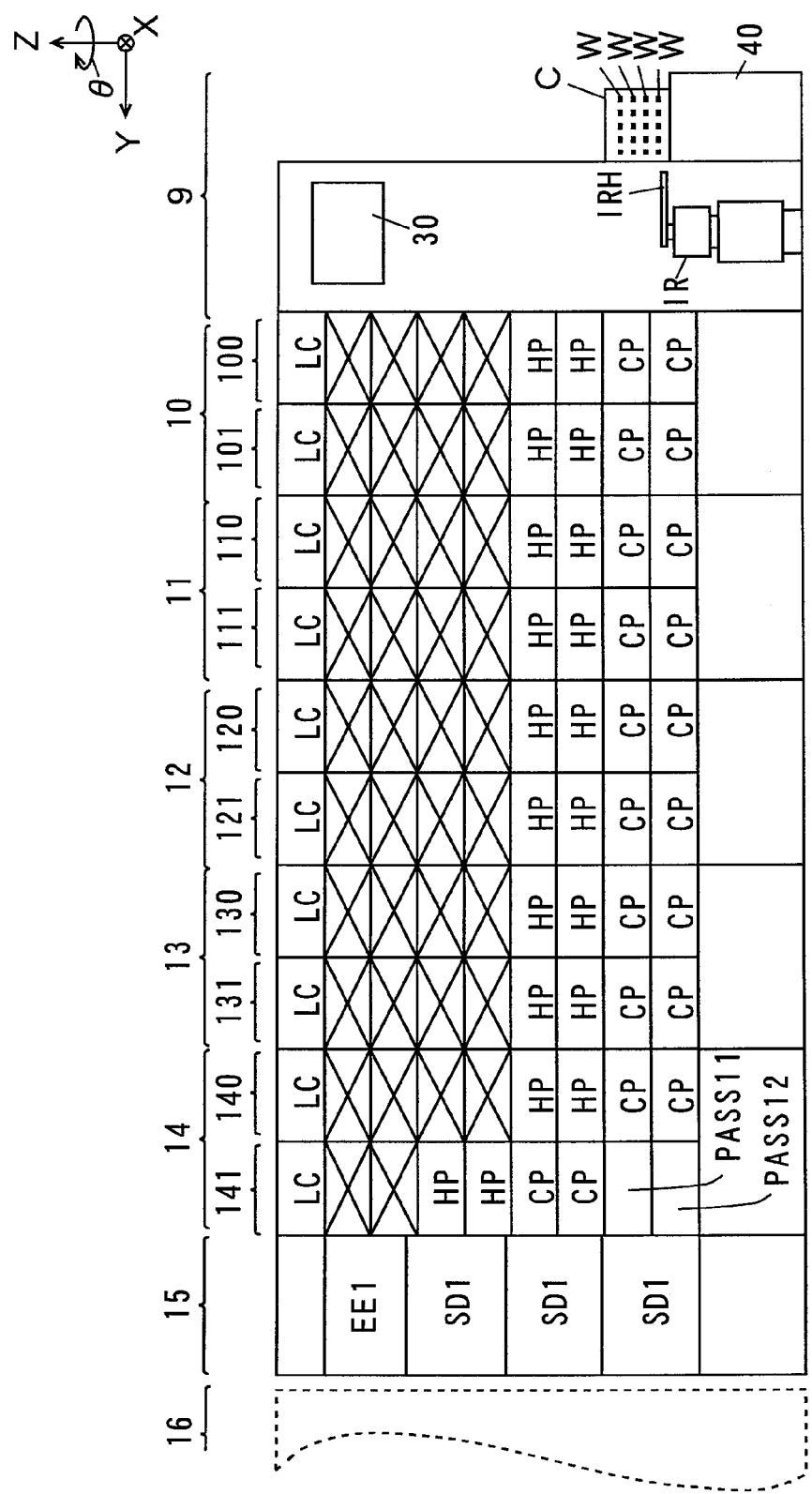
FIG. 3 is a schematic side view of the substrate processing apparatus illustrated in FIG. 1 as viewed from the −X direction.

FIG. 2 is a schematic side view of the substrate processing apparatus 500 illustrated in FIG. 1 as viewed from the +X direction, and FIG. 3 is a schematic side view of the substrate processing apparatus 500 illustrated in FIG. 1 as viewed from the -X direction. FIG. 2 mainly illustrates the configuration on the +X side of the substrate processing apparatus 500, and FIG. 3 mainly illustrates the configuration on the -X side of the substrate processing apparatus 500.

The configuration on the +X side of the substrate processing apparatus 500 will be first described with reference to FIG. 2. As illustrated in FIG. 2, the coating processing group 50 in the anti-reflection film processing block 10 (see FIG. 1) has a vertical stack of three coating units BARC. Each of the coating units BARC includes a spin chuck 51 for rotating the substrate W with the substrate W held in a horizontal attitude by suction, and a supply nozzle 52 for supplying a coating liquid for an anti-reflection film to the substrate W held on the spin chuck 51.

The coating processing group 60 in the resist film processing block 11 (see FIG. 1) has a vertical stack of three coating units RES. Each of the coating units RES includes a spin chuck 61 for rotating the substrate W with the substrate W held in a horizontal attitude by suction, and a supply nozzle 62 for supplying a coating liquid for a resist film to the substrate W held on the spin chuck 61.

The development processing group 70 in the development processing block 12 has a vertical stack of five development processing units DEV. Each of the development processing units DEV includes a spin chuck 71 for rotating the substrate W with the substrate W held in a horizontal attitude by suction, and a supply nozzle 72 for supplying a development liquid to the substrate W held on the spin chuck 71.

The coating processing group 80 in the resist cover film processing block 13 has a vertical stack of three coating units COV. Each of the coating units COV includes a spin chuck 81 for rotating the substrate W with the substrate W held in a horizontal attitude by suction, and a supply nozzle 82 for supplying a coating liquid for a resist cover film to the substrate W held on the spin chuck 81. Materials having a low affinity for resists and water (materials having low reactivity to resists and water) can be used as the coating liquid for the resist cover film. An example of the coating liquid is fluororesin. Each of the coating units COV forms the resist cover film on the resist film formed on the substrate W by applying the coating liquid onto the substrate W while rotating the substrate W.

The removal processing group 90 in the resist cover film removal block 14 has a vertical stack of three removal units REM. Each of the removal units REM includes a spin chuck 91 for rotating the substrate W with the substrate W held in a horizontal attitude by suction, and a supply nozzle 92 for supplying a stripping liquid (e.g. fluororesin) to the substrate W held on the spin chuck 91. Each of the removal units REM removes the resist cover film formed on the substrate W by applying the stripping liquid onto the substrate W while rotating the substrate W.

A method for removing the resist cover films in the removal units REM is not limited to the above-mentioned examples. For example, the resist cover film may be removed by supplying the stripping liquid onto the substrate W while moving a slit nozzle above the substrate W.

The interface block 15 has a vertical stack of the edge exposure unit EEW and the three second cleaning/drying processing units SD2 on the +X side. The edge exposure unit EEW includes a spin chuck 98 for rotating the substrate W with the substrate held in a horizontal attitude by suction, and a light irradiator 99 for exposing a peripheral portion of the substrate W held on the spin chuck 98.

The configuration on the −X side of the substrate processing apparatus 500 will be then described with reference to FIG. 3. As illustrated in FIG. 3, each of the thermal processing groups 100 and 101 in the anti-reflection film processing block 10 has a stack of two heating units (hot plates) HP and two cooling units (cooling plates) CP. Each of the thermal processing groups 100 and 101 has a local controller LC for controlling the respective temperatures of the heating units HP and the cooling units CP arranged in its uppermost part.

Each of the thermal processing groups 110 and 111 in the resist film processing block 11 has a stack of two heating units HP and two cooling units CP. Each of the thermal processing groups 110 and 111 also has a local controller LC for controlling the respective temperatures of the heating units HP and the cooling units CP arranged in its uppermost part.

Each of the thermal processing groups 120 and 121 in the development processing block 12 has a stack of two heating units HP and two cooling units CP. Each of the thermal processing groups 120 and 121 also has a local controller LC for controlling the respective temperatures of the heating units HP and the cooling units CP arranged in its uppermost part.

Each of the thermal processing groups 130 and 131 in the resist cover film processing block 13 has a stack of two heating units HP and two cooling units CP. Each of the thermal processing groups 130 and 131 also has a local controller LC for controlling the respective temperatures of the heating units HP and the cooling units CP arranged in its uppermost part.

In the resist cover film removal block 14, the thermal processing group 140 has a vertical stack of two heating units HP and two cooling units CP, and the thermal processing group 141 has a vertical stack of two heating units HP, two cooling units CP, and substrate platforms PASS11 and PASS12. Each of the thermal processing groups 140 and 141 has a local controller LC for controlling the respective temperatures of the heating units HP and the cooling units CP arranged in its uppermost part.

The interface block 15 will be then described in detail with reference to FIG. 4.

Figure 4:
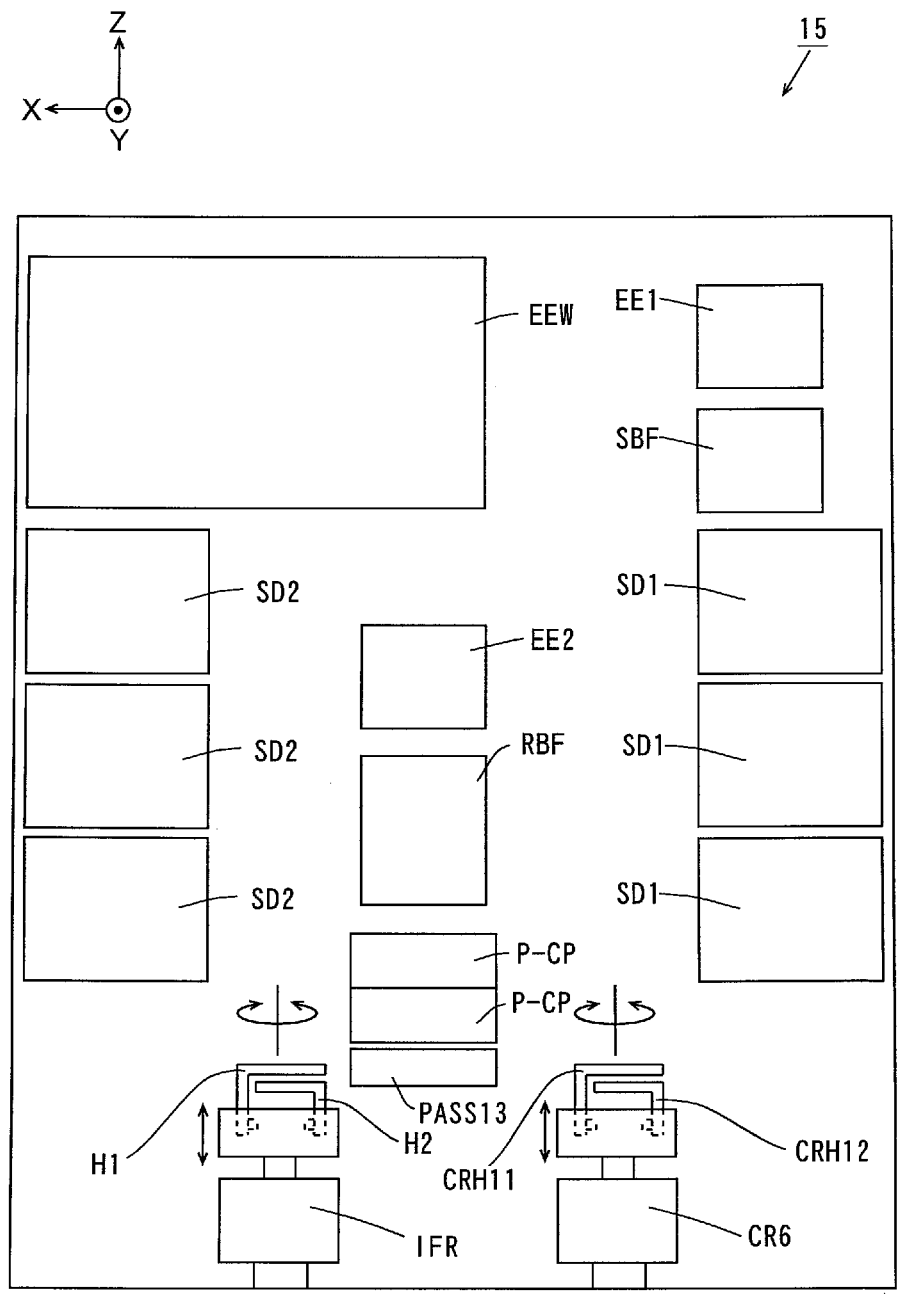
FIG. 4 is a schematic side view of an interface block as viewed from the +Y side.

FIG. 4 is a schematic side view of the interface block 15 as viewed from the +Y side. As illustrated in FIG. 4, the interface block 15 has a stack of the first inspection unit EE1, the sending buffer unit SBF, and the three first cleaning/drying processing units SD1 on the −X side. The interface block 15 has the edge exposure unit EEW arranged on the +X side in its upper portion.

The interface block 15 has a vertical stack of the second inspection unit EE2, the return buffer unit RBF, the two placement/cooling units P-CP, and the substrate platform PASS13 at its substantially central portion below the edge exposure unit EEW. The interface block 15 has a vertical stack of the three second cleaning/drying processing units SD2 arranged on the +X side below the edge exposure unit EEW.

The interface block 15 has the sixth central robot CR6 and the interface transport mechanism IFR in its lower portion. The sixth central robot CR6 is provided so as to be vertically movable and rotatable in an area among the first inspection unit EE1, the sending buffer unit SBF, the first cleaning/drying processing units SD1, the edge exposure unit EEW, the return buffer unit RBF, the placement/cooling units P-CP, and the substrate platform PASS13. The interface transport mechanism IFR is provided so as to be vertically movable and rotatable in an area among the second inspection unit EE2, the placement/cooling units P-CP, the substrate platform PASS13, and the second cleaning/drying processing units SD2.

The respective numbers of coating units BARO, RES, and COV, developing processing units DEV, removal units REM, heating units HP, cooling units CP, and placement/cooling units P-CP, first and second inspection units EE1 and EE2, and first and second cleaning/driving processing units SD1 and SD2 may be changed, as needed, according to the processing speed of each of the processing blocks.

(2) Operation of Substrate Processing Apparatus

The operation of the substrate processing apparatus 500 according to the present embodiment will be then described with reference to FIGS. 1 to 4.

(2-1) Operations of Indexer Block to Resist Cover Film Removal Block

First, the operations of the indexer block 9 to the resist cover film removal block 14 will be briefly described.

Carriers C that store a plurality of substrates W in a multiple stage are respectively carried onto the carrier platforms 40 in the indexer block 9. The indexer robot IR takes out the unprocessed substrate W that is stored in the carrier C using the hand IRH. Thereafter, the indexer robot IR rotates in the ±θ direction while moving in the ±X direction, to place the unprocessed substrate W on the substrate platform PASS1.

Although FOUPs (Front Opening Unified Pods) are adopted as the carriers C in the present embodiment, the present invention is not limited to the same. For example, SMIF (Standard Mechanical Inter Face) pods, OCs (Open Cassettes) that expose the stored substrates W to outside air, and so on may be used.

Furthermore, although linear-type transport robots that move their hands forward or backward by linearly sliding them to the substrate W are respectively used as the indexer robot IR, the first to sixth central robots CR1 to CR6, and the interface transport mechanism IFR, the present invention is not limited to the same. For example, multi-joint type transport robots that linearly move their hands forward and backward by moving their joints may be used.

The unprocessed substrate W placed on the substrate platform PASS1 is received by the first central robot CR1 in the anti-reflection film processing block 10. The first central robot CR1 carries the substrate W into the thermal processing group 100 or 101.

Thereafter, the first central robot CR1 takes out the thermally processed substrate W from the thermal processing group 100 or 101 and carries the substrate W into the coating processing group 50. In the coating processing group 50, the coating unit BARC forms a coating of an anti-reflection film on the substrate W in order to reduce standing waves and halation generated during the exposure processing.

The first central robot CR1 then takes out the substrate W after the coating processing from the coating processing group 50 and carries the substrate W into the thermal processing group 100 or 101. Thereafter, the first central robot CR1 takes out the thermally processed substrate W from the thermal processing group 100 or 101 and places the substrate W on the substrate platform PASS3.

The substrate W placed on the substrate platform PASS3 is received by the second central robot CR2 in the resist film processing block 11. The second central robot CR2 carries the substrate W into the thermal processing group 110 or 110.

Thereafter, the second central robot CR2 takes out the thermally processed substrate W from the thermal processing group 110 or 111 and carries the substrate W into the coating processing group 60. In the coating processing group 60, the coating unit RES forms a coating of a resist film on the substrate W that has been coated with the anti-reflection film.

The second central robot CR2 then takes out the substrate W after the coating processing from the coating processing group 60 and carries the substrate W into the thermal processing group 110 or 111. In the thermal processing group 110 or 111, heating processing and cooling processing of the resist film are successively performed. Thereafter, the second central robot CR2 takes out the thermally processed substrate W from the thermal processing group 110 or 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the resist cover film processing block 13. The fourth central robot CR4 carries the substrate W into the coating processing group 80. In the coating processing group 80, the coating unit COV forms a coating of a resist cover film on the substrate W that has been coated with the resist film.

The fourth central robot CR4 then takes out the substrate W after the coating processing from the coating processing group 80 and carries the substrate W into the thermal processing group 130 or 131. In the thermal processing group 130 or 131, heating processing and cooling processing of the resist cover film are successively performed. Thereafter, the fourth central robot CR4 takes out the thermally processed substrate W from the thermal processing group 130 or 131 and places the substrate W on the substrate platform PASS9.

The substrate W placed on the substrate platform PASS9 is received by the fifth central robot CR5 in the resist cover film removal block 14. The fifth central robot CR5 places the substrate W on the substrate platform PASS11.

The substrate W placed on the substrate platform PASS11 is received by the sixth central robot CR6 in the interface block 15, and is subjected to predetermined processing in the interface block 15 and the exposure device 16, as described below. After the substrate W is subjected to the predetermined processing in the interface block 15 and the exposure device 16, the sixth central robot CR6 carries the substrate W into the thermal processing group 141 in the resist cover film removal block 14.

In the thermal processing group 141, the substrate W is subjected to post-exposure bake (PEB). Thereafter, the sixth central robot CR6 takes out the substrate W from the thermal processing group 141 and places the substrate W on the substrate platform PASS12.

Although the substrate W is subjected to the post-exposure bake in the thermal processing group 141 in the present embodiment, the substrate W may be subjected to post-exposure bake in the thermal processing group 140.

The substrate W placed on the substrate platform PASS12 is received by the fifth central robot CR5 in the resist cover film removal block 14. The fifth central robot CR5 carries the substrate W into the removal processing group 90. In the removal processing group 90, the removal unit REM removes the resist cover film on the substrate W.

The fifth central robot CR5 then takes out the processed substrate W from the removal processing group 90 and places the substrate W on the substrate platform PASS10.

The substrate W placed on the substrate platform PASS10 is placed on the substrate platform PASS8 by the fourth central robot CR4 in the resist cover film processing block 13.

The substrate W placed on the substrate platform PASS8 is received by the third central robot CR3 in the development processing block 12. The third central robot CR3 carries the substrate W into the development processing group 70. In the development processing group 70, the exposed substrate W is subjected to development processing.

The third central robot CR3 then takes out the substrate W after the development processing from the development processing group 70 and carries the substrate W into the thermal processing group 120 or 121. Thereafter, the third central robot CR3 takes out the thermally processed substrate W from the thermal processing group 120 or 121 and places the substrate W on the substrate platform PASS6.

The substrate W placed on the substrate platform PASS6 is placed on the substrate platform PASS4 by the second central robot CR2 in the resist film processing block 11. The substrate placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Each processing for the substrate W in the substrate processing apparatus 500 is thus terminated.

(2-2) Operation of Interface Block

The operation of the interface block 15 will be then described in detail.

As described above, the substrate W carried into the indexer block 9 is subjected to predetermined processing, and is then placed on the substrate platform PASS11 in the resist cover film removal block 14 (FIG. 1).

The substrate W placed on the substrate platform PASS11 is received by the sixth central robot CR6 in the interface block 15. The sixth central robot CR6 carries the substrate W into the edge exposure unit EEW (FIG. 4). In the edge exposure unit EEW, a peripheral portion of the substrate W is subjected to exposure processing.

The sixth central robot CR6 then takes out the substrate W after the exposure processing from the edge exposure unit EEW and carries the substrate W into any one of the first cleaning/drying processing units SD1. In the first cleaning/drying processing unit SD1, the substrate W before the exposure processing is subjected to cleaning and drying processing, as described above.

The sixth central robot CR6 then takes out the substrate after the cleaning and drying processing from the first cleaning/drying processing unit SD1 and carries the substrate W into the first inspection unit EE1. In the first inspection unit EE1, the state of the substrate W before the exposure processing is inspected, as described above. The specific contents of the inspection in the first inspection unit EE1 will be described below.

The results of the inspection in the first and second inspection units EE1 and EE2 are given to the main controller 30. The main controller 30 determines whether or not the state of the substrate W is normal based on the results of the inspection while controlling each of the processing blocks such that the substrate that is normal in the state and the substrate W that is abnormal in the state are respectively subjected to different types of processing.

The substrate W that is abnormal in the inspection in the first inspection unit EE1 is recovered without being subjected to the subsequent processing. More specifically, the abnormal substrate W is taken out of a bevel portion inspection unit EE by the sixth central robot CR6, and is then carried into the sending buffer unit SBF. After termination of processing of the substrates W in one lot, the substrate W in the sending buffer unit SBF is recovered by a worker, and is separately subjected to measures such as discarding or rework (reprocessing). A buffer for storing the abnormal substrate W may be provided separately from the sending buffer unit SBF.

The abnormal substrate W may be returned to the indexer block 9 by the first to sixth central robots CR1 to CR6 and recovered in the carrier C (FIG. 1) by the indexer robot IR.

The operation of the interface block 15 for the normal substrate W will be described below.

The normal substrate W is taken out of the first inspection unit E1 by the sixth central robot CR6, and is then carried into the placement/cooling unit P-CP. The substrate W carried into the placement/cooling unit P-CP is maintained at the same temperature as that in the exposure device 16 (e.g., 23° C.).

The substrate W maintained at the above-mentioned predetermined temperature in the placement/cooling unit P-CP is then received with the upper hand H1 of the interface transport mechanism IFR (FIG. 4) and carried into the substrate inlet 16a in the exposure device 16 (FIG. 1).

A period of time for the exposure processing by the exposure device 16 is generally longer than those for other processing and transporting processes. As a result, the exposure device 16 cannot receive the subsequent substrates W in many cases. In this case, the substrate W is temporarily stored in the sending buffer unit SBF. In the present embodiment, the sixth central robot CR6 transports the substrate W taken out of the first inspection unit EE1 to the sending buffer unit SBF.

The substrate W that has been subjected to the exposure processing in the exposure device 16 is carried out of the substrate outlet 16b (FIG. 1) with the lower hand H2 of the interface transport mechanism IFR (FIG. 4). The interface transport mechanism IFR carries the substrate W into the second inspection unit EE2 with the hand H2. In the second inspection unit EE2, the state of the substrate W after the exposure processing is inspected, as described above. The specific contents of the inspection in the second inspection unit EE2 will be described in detail below.

When the substrate W is abnormal in the inspection in the second inspection unit EE2, the alarm device 30b generates an alarm to the worker. The alarm device 30b includes a buzzer or a lamp, for example.

Only the normal substrate W is carried into the exposure device 16. When the substrate after the exposure processing is abnormal, therefore, it is considered that an abnormality has occurred in the substrate W within the exposure device 16. When the alarm device 30b generates an alarm, the worker stops the operations of the substrate processing apparatus 500 and the exposure device 16, and maintains the exposure device 16.

Even when it is determined that the state of the substrate W is normal in the second inspection unit EE2, if the result of the inspection in the second inspection unit EE2 gets worse than the result of the inspection in the first inspection unit EE1, the alarm device 30b may generate an alarm in a similar manner to the above.

The substrate W that is abnormal in the inspection in the second inspection unit EE2 is recovered without being subjected to the subsequent processing. More specifically, the interface transport mechanism IFR takes out the abnormal substrate W from the second inspection unit EE2, and then places the substrate W on the substrate platform PASS13. The sixth central robot CR6 takes out the substrate W from the substrate platform PASS13, and carries the substrate W into the return buffer unit RBF. After termination of processing of the substrates W in one lot, the substrate W in the return buffer unit RBF is recovered by the worker, and is separately subjected to measures such as discarding or rework (reprocessing). A buffer for storing the abnormal substrate W may be provided separately from the return buffer unit RBF.

The abnormal substrate W may be returned to the indexer block 9 by the interface transport mechanism IFR and the first to sixth central robots CR1 to CR6 and recovered in the carrier C (FIG. 1) by the indexer robot IR.

The substrate W that is normal in the inspection in the second inspection unit EE2 is taken out of the second inspection unit EE2 with the hand H2 of the interface transport mechanism IFR, and is then carried into any one of the second cleaning/drying processing units SD2. In the second cleaning/drying processing unit SD2, the substrate W after the exposure processing is subjected to cleaning and drying processing, as described above.

The substrate W that has been subjected to the cleaning and drying processing in the second cleaning/drying processing unit SD2 is taken out with the hand H1 of the interface transport mechanism IFR (FIG. 4). The interface transport mechanism IFR places the substrate W on the substrate platform PASS13 with the hand H1.

The substrate W placed on the substrate platform PASS13 is received by the sixth central robot CR6. The sixth central robot CR6 transports the substrate W to the thermal processing group 141 in the resist cover film removal block 14 (FIG. 1).

When the resist cover film removal block 14 cannot temporarily receive the substrate W due to a failure or the like in the removal unit REM (FIG. 2), the substrate W after the exposure processing can be temporarily stored in the return buffer unit RBF.

(3) Inspection Unit

Figure 5:
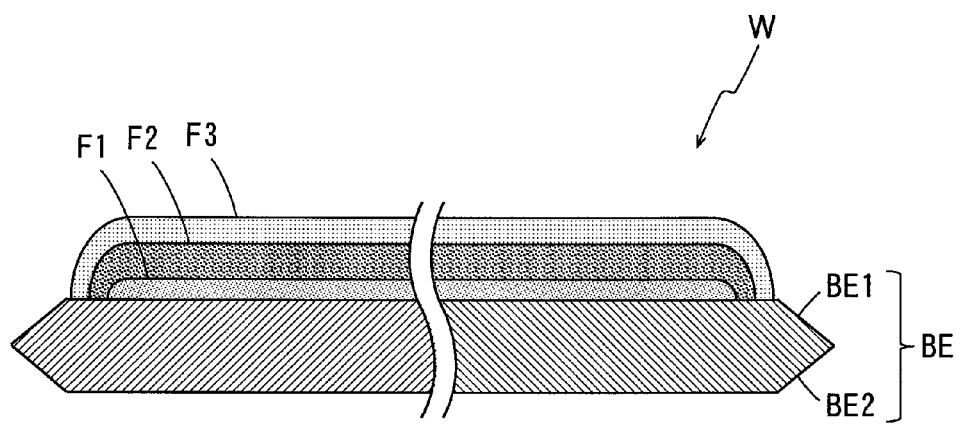
FIG. 5 is a schematic sectional view of a substrate.
Figure 6:
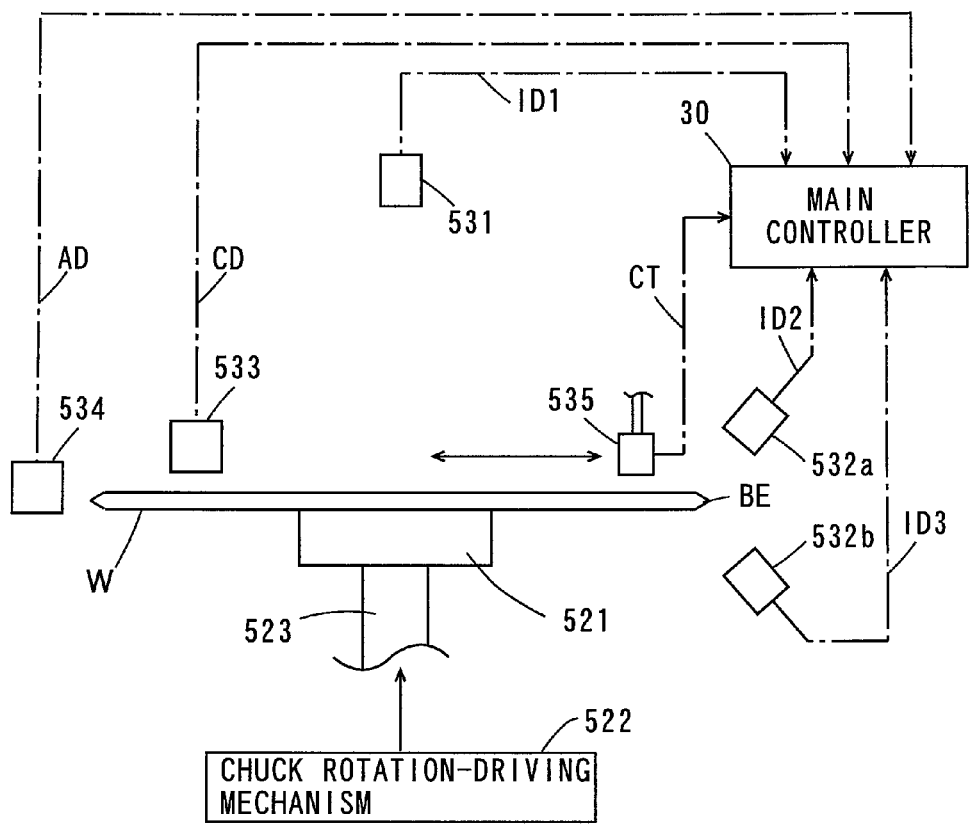
FIG. 6 is a schematic side view illustrating the configuration of a first inspection unit.

FIG. 5 is a schematic sectional view of the substrate W that is inspected by the first and second inspection units EE1 and EE2. FIG. 6 is a schematic side view illustrating the configuration of the first inspection unit EE1.

(3-1) Substrate

The state of the substrate W during the inspection by the first and second inspection units EE1 and EE2 will be first described. As illustrated in FIG. 5, the substrate W has a flat top surface and a flat back surface, and has a bevel portion BE in its outer periphery. The bevel portion BE includes an upper bevel region BE1 inclined to continuously communicate with the top surface of the substrate W and a lower bevel region BE2 inclined to continuously communicate with the back surface of the substrate W.

During the inspection in the first and second inspection units EE1 and EE2, an anti-reflection film F1, a resist film F2, and a resist cover film F3 are formed one over the other on the top surface of the substrate W. In the example illustrated in FIG. 5, on the top surface of the substrate W, the resist film F2 is formed to cover the anti-reflection film F1, and the resist cover film F3 is formed to cover the resist film F2.

The respective states where the films F1 to F3 are formed are not limited to the same. For example, the resist film F2 may be formed on a region excluding a peripheral portion of the anti-reflection film F1, or the films F1 to F3 may be formed to extend onto the upper bevel region BE1.

(3-2) Configuration of Inspection Unit

The configuration of the first inspection unit EE1 will be then described. The second inspection unit EE2 has a configuration similar to the first inspection unit EE1 illustrated in FIG. 6.

As illustrated in FIG. 6, the first inspection unit EE1 is provided with a spin chuck 521 for horizontally holding the substrate W while rotating the substrate W around a vertical rotating shaft 523 passing through the center of the substrate W.

The spin chuck 521 is secured to an upper end of the rotating shaft 523 that is rotated by a chuck rotation-driving mechanism 522. A suction path (not illustrated) is formed in the spin chuck 521. By evacuating the suction path with the substrate W placed on the spin chuck 521 to adsorb the back surface of the substrate W to the spin chuck 521 under vacuum, the substrate W can be held in a horizontal attitude.

A macro inspection camera 531 is arranged above the spin chuck 521. The macro inspection camera 531 images the whole of the resist cover film F1 on the substrate W. Image data ID1 obtained by the macro inspection camera 531 is fed to the main controller 30.

Bevel inspection cameras 532a and 532b are arranged in the vicinity of the bevel portion BE in the substrate W held by the spin chuck 521. The bevel inspection camera 532a images the upper bevel region BE1 (FIG. 5) in the substrate W, and the bevel inspection camera 532b images the lower bevel region BE2 (FIG. 5) in the substrate W.

The substrate W is rotated by the spin chuck 521 so that the whole of the upper bevel region BE1 and the lower bevel region BE2 in the substrate W can be imaged. Image data ID2 obtained by the bevel inspection camera 532a and image data ID3 obtained by the bevel inspection camera 532b are fed to the main controller 30.

Although in the example illustrated in FIG. 6, the separate bevel inspection cameras 532a and 532b respectively image the upper bevel region BE1 and the lower bevel region BE2 in the substrate W, a common bevel inspection camera may image the upper bevel region BE1 and the lower bevel region BE2 in the substrate W.

A film quality inspection device 533 is arranged in close proximity to the top surface of the substrate W held by the spin chuck 521. The film quality inspection device 533 includes a spectrophotometer, for example, and irradiates the resist cover film F3 on the substrate W with light beams respectively having various wavelengths and analyzes a component of the resist cover film F3 based on reflected light beams.

The spin chuck 521 rotates the substrate W so that the component of the resist cover film F3 can be analyzed in a plurality of portions of the resist cover film F3. Component data CD obtained by the film quality inspection device 533 is fed to the main controller 30.

A contact angle measurement device 534 is arranged beside the substrate W held by the spin chuck 521. The contact angle measurement device 534 measures the contact angle of a liquid on the resist cover film F3. In this case, a liquid (e.g., pure water) is allowed to drop on the substrate W by a liquid supplier (not illustrated), and the contact angle thereof is measured. Contact angle data AD obtained by the contact angle measurement device 534 is fed to the main controller 30.

A film thickness measurement device 535 is arranged so as to be movable between an area above the center and an area above the peripheral portion of the substrate W held by the spin chuck 521. The film thickness measurement device 535 continuously measures the film thickness of the resist cover film F3 on the substrate W while moving between the area above the center and the area above the peripheral portion of the substrate W, and gives the result of the measurement to the main controller 30 as film thickness data CT.

During the imaging by the macro inspection camera 531, the film quality inspection device 533, the contact angle measurement device 534, and the film thickness measurement device 535 move outside of the substrate W such that the macro inspection camera 531 can image the whole of the top surface of the substrate W.

(3-3) Substrate State Determination Processing

The main controller 30 performs substrate state determination processing based on the fed image data ID1 to ID3, component data CD, contact angle data AD, and film thickness data CT. Thus, the main controller 30 determines whether or not the state of the substrate W is normal.

Figure 7:
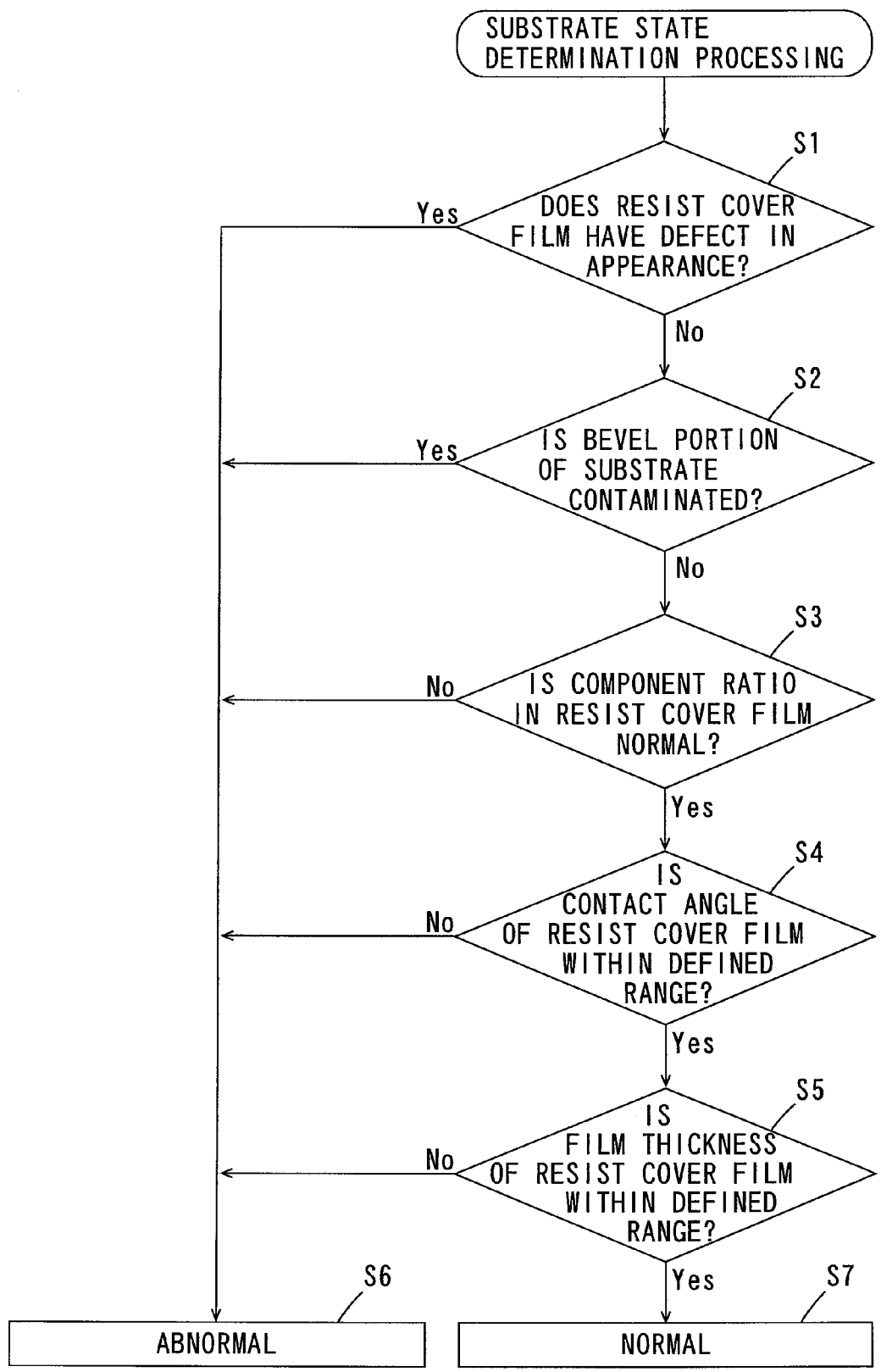
FIG. 7 is a flowchart of substrate state determination processing by a main controller.

FIG. 7 is a flowchart of the substrate state determination processing by the main controller 30.

In step S1, the main controller 30 first determines whether or not the resist cover film F3 on the substrate W has a defect in appearance based on the image data ID1 from the macro inspection camera 531. Examples of the defect in appearance of the resist cover film F3 include deviation of a formed region, adhesion of particles, and stripping.

If the resist cover film F3 has a defect in appearance (YES in step S1), then in step S6, the main controller 30 determines that the substrate W is abnormal.

If the resist cover film F3 has no defect in appearance (NO in step S1), then in step S2, the main controller 30 determines whether or not the bevel portion BE in the substrate W is contaminated based on the image data ID2 and ID3 from the bevel inspection cameras 532a and 532b.

If the bevel portion BE in the substrate W is contaminated (YES in step S2), then in step S6, the main controller 30 determines that the substrate W is abnormal.

If the bevel portion BE in the substrate W is not contaminated (NO in step S2), then in step S3, the main controller 30 determines whether or not a component ratio in the resist cover film F3 is normal based on the component data CD from the film quality inspection device 533. More specifically, an error between a standard value of a component ratio previously stored and the component ratio obtained by the film quality inspection device 533 is calculated. The main controller 30 determines that the component ratio in the resist cover film F3 is normal if the calculated error is within a defined range, while determining that the component ratio in the resist cover film F3 is abnormal if the calculated error is not within the defined range.

If the component ratio in the resist cover film F3 is abnormal (No in step S3), then in step S6, the main controller 30 determines that the substrate W is abnormal.

If the component ratio in the resist cover film F3 is normal (YES in step S3), then in step S4, the main controller 30 determines whether or not the contact angle of the liquid on the resist cover film F3 is within a defined range based on the contact angle data AD from the contact angle measurement device 534. In this case, during the exposure processing in the exposure device 16, the defined range of the contact angle is set such that the liquid can be stably held on the substrate W.

If the contact angle of the liquid on the resist cover film F3 is not within the defined range (NO in step S4), then in step S6, the main controller 30 determines that the substrate W is abnormal.

If the contact angle of the liquid on the resist cover film F3 is within the defined range (YES in step S4), then in step S5, the main controller 30 determines whether or not the film thickness of the resist cover film F3 is within a defined range based on the film thickness data CT from the film thickness measurement device 535.

If the film thickness of the resist cover film F3 is not within the defined range (NO in step 5), then in step S6, the main controller 30 determines that the substrate W is abnormal. If the film thickness of the resist cover film F3 is within the defined range (YES in step S5), then in step S7, the main controller 30 determines that the substrate W is normal.

If the resist cover film F3 is formed in the upper bevel region BE1 of the bevel portion BE, the main controller 30 may determine whether or not the resist cover film F3 is stripped on the upper bevel region BE1 based on the image data ID2 from the bevel inspection camera 532a. In this case, if the resist cover film F3 is stripped on the upper bevel region BE1, the main controller 30 determines that the substrate W is abnormal.

(4) Effects of Embodiment

In the present embodiment, the state of the substrate W before the exposure processing in the exposure device 16 is inspected in the first inspection unit EE1. If the substrate W is abnormal in the inspection in the first inspection unit EE1, the substrate W is not carried into the exposure device 16.

In this case, if even a portion of the resist cover film F3 is stripped, the substrate W is not carried into the exposure device 16. This prevents a component of the resist film F2 or the like from being eluted from the stripped portion of the resist cover film F3. This results in prevention of contamination in and damage to the exposure lens.

If the bevel portion BE in the substrate W is contaminated, the substrate W is not carried into the exposure device 16. This prevents the contamination of the bevel portion BE in the substrate W from propagating to the exposure device 16.

If the component ratio in the resist cover film F3 is abnormal, the liquid cannot be stably held on the substrate W during the exposure processing. Alternatively, the component of the resist cover film F3 is eluted in the liquid. If the component ratio in the resist cover film F3 is abnormal, the substrate W is not carried into the exposure device 16. This prevents the liquid supplied onto the substrate W during the exposure processing from flowing out to the periphery of the substrate W and prevents the inside of the exposure device 16 from being contaminated by the component eluted from the resist cover film F3.

If the contact angle of the liquid on the resist cover film F3 is not proper, the liquid cannot be stably held on the substrate W during the exposure processing. If the contact angle of the liquid on the resist cover film F3 is not within the defined range, the substrate W is not carried into the exposure device 16. This prevents the liquid supplied onto the substrate W from flowing out to the periphery of the substrate W.

If the film thickness of the resist cover film F3 is not proper, the component of the resist film F2 or the like cannot be sufficiently prevented from being eluted during the exposure processing. Alternatively, it is probable that the resist cover film F3 is stripped. If the film thickness of the resist cover film F3 is not within the defined range, therefore, the substrate W is not carried into the exposure device 16. This sufficiently prevents the component of the resist film F2 or the like from being eluted and prevents the resist cover film F3 from being stripped during the exposure processing.

The inspection of the state of the substrate W by the first inspection unit EE1 is performed after the cleaning and drying processing of the substrate W by the first cleaning/drying processing unit SD1. When the substrate W is subjected to the cleaning processing and the drying processing using the liquid such as the cleaning liquid or the rinse liquid, the resist cover film F3 is easily stripped during the processing. Therefore, the stripping of the resist cover film F during the cleaning and drying processing can be reliably detected by inspecting the state of the substrate W after the cleaning and drying processing.

In the present embodiment, the state of the substrate W after the exposure processing in the exposure device 16 is inspected in the second inspection unit EE2. In this case, the change in the state of the substrate W before and after the exposure processing can be detected. This enables quick recognition that an abnormality has occurred in the substrate within the exposure device 16. Therefore, the exposure device 16 can be quickly maintained after the abnormality occurs in the substrate W within the exposure device 16. As a result, the contamination of the exposure lens can be minimized.

In the first and second inspection units EE1 and EE2, the appearance of the resist cover film F3 is inspected. The change in the appearance of the resist cover film F3 before and after the exposure processing enables quick recognition that the resist cover film F3 is stripped within the exposure device 16. In this case, the component of the resist film F2 or the like may be eluted from the stripped portion of the resist cover film F3. Alternatively, the stripped portion of the resist cover film F3 may stay as a contaminant within the exposure device 16. Therefore, the exposure device 16 is quickly maintained so that the contamination of the exposure lens can be minimized.

The change in the appearance of the resist cover film F3 before and after the exposure processing enables quick recognition that a contaminant such as particles adheres to the resist cover film F3 within the exposure device 16. In this case, the inside of the exposure device 16 may be contaminated. Therefore, the exposure device 16 is quickly maintained so that the contamination of the exposure lens can be minimized.

In the first and second inspection units EE1 and EE2, the state of the bevel portion BE in the substrate W is inspected. The change in the state of the bevel portion BE in the substrate W before and after the exposure processing enables quick recognition that the bevel portion BE in the substrate W is contaminated within the exposure device 16. In this case, the inside of the exposure device 16 may also be contaminated. Therefore, the exposure device 16 is quickly maintained so that the contamination of the exposure lens can be minimized.

In the first and second inspection units EE1 and EE2, the component and the film thickness of the resist cover film F3 and the contact angle of the liquid on the resist cover film F3 are inspected. When the component, the film thickness, and the contact angle of the liquid change before and after the exposure processing, the component of the resist cover film F3 may be eluted during the exposure processing. Therefore, the exposure device 16 is quickly maintained so that the contamination of the exposure lens can be minimized.

The inspection of the state of the substrate W in the second inspection unit EE2 is performed before the cleaning and drying processing by the second cleaning/drying processing unit SD2. When the substrate W is subjected to the cleaning processing and the drying processing using the liquid such as the cleaning liquid or the rinse liquid, the resist cover film F3 is easily stripped. Therefore, the inspection of the state of the substrate W before the cleaning and drying processing by the second cleaning/drying processing unit SD2 enables accurate recognition of the state of the substrate W immediately after the exposure processing.

5) Modifications (5-1

Although in the above-mentioned embodiment, the inspection of the appearance of the resist cover film F3, the inspection of the contamination of the bevel portion BE, the inspection of the component of the resist cover film F3, the inspection of the contact angle of the liquid on the resist cover film F3, and the inspection of the film thickness of the resist cover film F3 are performed in each of the first and second inspection units EE1 and EE2, the inspections may be respectively made in separate devices.

More specifically, a device for inspecting the appearance of the resist cover film F3, a device for inspecting the bevel portion, a device for inspecting the component of the resist cover film F3, a device for inspecting the contact angle of the liquid on the resist cover film F3, and a device for inspecting the film thickness of the resist cover film F3 are respectively provided. The substrate W is successively carried into the inspection devices before being carried into the exposure device 16 so that the respective inspections are performed. The substrate W is successively carried into the inspection devices after being carried out of the exposure device 16 so that the respective inspections are performed.

In this case, the control of the subsequent processing of the substrate W depending on the result of the inspection in each of the inspection devices can prevent contamination in the exposure device 16, as in the above-mentioned embodiment. The detection of the change in the state of the substrate W before and after the exposure processing enables quick recognition that an abnormality has occurred in the substrate W within the exposure device 16. This enables the exposure device 16 to be maintained at proper timing.

(5-2)

Although in the above-mentioned embodiment, the substrate W is inspected before and after the exposure processing in the interface block 15, the present invention is not limited to the same. A block for inspecting the substrate W before and after the exposure processing may be separately provided between the interface block 15 and the exposure device 16.

In this case, the first and second inspection units EE1 and EE2 may be provided in the block. Alternatively, more than one devices that respectively perform separate inspections may be provided in the block.

(5-3)

Although in the above-mentioned embodiment, the state of the substrate W before the exposure processing is inspected in the first inspection unit E1, and the state of the substrate W after the exposure processing is inspected in the second inspection unit E2, the substrate W before the exposure processing and the substrate W after the exposure processing may be inspected in a common inspection unit.

(5-4)

Although in the above-mentioned embodiment, the first and second cleaning/drying processing units SD1 and SD2 are provided in the interface block 15, the first and second cleaning/drying processing units SD1 and SD2 may be provided in the other block such as the resist cover film processing block 13 or the reset cover film removal block 14.

(5-5)

Although in the above-mentioned embodiment, the inspection of the state of the substrate W after the exposure processing in the second inspection unit EE2 is performed before the cleaning and drying processing by the second cleaning/drying processing unit SD2, the inspection of the state of the substrate W after the exposure processing in the second inspection unit EE2 may be performed after the cleaning and drying processing by the second cleaning/drying processing unit SD2.

(6) Another Embodiment

Although in the above-mentioned embodiment, the resist cover film F3 is formed to cover the resist film F2, and the exposure processing is performed with the liquid brought into contact with the resist cover film F3, the present invention is not limited to the same. Exposure processing may be performed with a liquid brought into contact with the other film.

When a resist film F2 is highly hydrophobic, for example, a resist cover film F3 need not be formed. In the case, the exposure processing is performed with the liquid brought into contact with the resist film F2.

In this case, the inspection of the appearance of the resist film F2, the inspection of the contamination of a bevel portion BE, the inspection of a component of the resist film F2, the inspection of the contact angle of the liquid on the resist film F2, and the inspection of the film thickness of the resist film F2 are performed in each of first and second inspection units EE1 and EE2.

(7) Correspondences Between Constituent Elements in the Claims and Parts in Embodiments In the following two paragraphs, non-limiting examples of correspondences between various elements recited in the claims below and those described above with respect to various preferred embodiments of the present invention are explained.

In the embodiments described above, the indexer block 9, the anti-reflection film processing block 10, the resist film processing block 11, the development processing block 12, the resist cover film processing block 13, and the resist cover film removal block 14 are examples of a processing section, the interface block 15 is an example of an interface, the coating units RES and COV are examples of a film formation unit, the thermal processing groups 110 and 111 for resist film or the thermal processing groups 130 and 131 for resist cover film are examples of a thermal processing unit, and the main controller 30 is an example of a controller.

The macro inspection camera 531 is an example of an appearance inspection device, the bevel inspection cameras 532a and 532b are examples of a bevel portion inspection device, the film quality inspection device 533 is an example of a component inspection device, the contact angle measurement device 534 is an example of a contact angle inspection device, the film thickness measurement device 535 is an example of a film thickness inspection device, the first cleaning/drying processing unit SD1 is an example of a cleaning processing unit, the resist film F2 or the resist cover film F3 is an example of a first film, and the resist film F2 is an example of a second film.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus arranged adjacent to an exposure device that subjects a substrate to exposure processing using a liquid immersion method, comprising:
    a processing section that subjects the substrate to processing;
    an interface provided adjacent to one end of said processing section for transferring and receiving the substrate between said processing section and said exposure device; and
    a controller that controls the operations of said processing section and said interface;
    wherein said processing section includes
    a film formation unit that forms a first film on a main surface of the substrate, and
    a thermal processing unit that subjects said first film formed by said film formation unit to thermal processing,
    one of said processing section and said interface includes a cleaning processing unit that performs cleaning processing of the main surface of the substrate after the thermal processing by said thermal processing unit and before the exposure processing by said exposure device, and
    said interface includes
    a first inspection unit that inspects a state of the main surface of the substrate after the cleaning processing by said cleaning processing unit and before the exposure processing by said exposure device, wherein
    said controller determines whether or not the state of the main surface of the substrate is normal based on the result of the inspection by said first inspection unit, and controls said interface to transport each substrate of normal state to said exposure device and not to transport each substrate of abnormal state to said exposure device,
    said first inspection unit includes an appearance inspection device that inspects the appearance of said first film formed by said film formation unit on said main surface, and
    said controller is responsive to said appearance inspection device and determines that the state of the substrate is not normal when the appearance of said first film is abnormal in the inspection by said appearance inspection device.

2. The substrate processing apparatus according to claim 1, wherein
    said first inspection unit includes a bevel portion inspection device that inspects a bevel portion in the substrate, and
    said controller determines that the state of the substrate is not normal when the bevel portion in the substrate is abnormal in the inspection by said bevel portion inspection device.

3. The substrate processing apparatus according to claim 1, wherein
    said first inspection unit includes a component inspection device that inspects a component of said first film formed by said film formation unit, and
    said controller determines that the state of the substrate is not normal when the component of said first film is abnormal in the inspection by said component inspection device.

4. The substrate processing apparatus according to claim 1, wherein
    said first inspection unit includes a contact angle inspection device that inspects the contact angle of a liquid on said first film formed by said film formation unit, and
    said controller determines that the state of the substrate is not normal when the contact angle of the liquid on said first film is abnormal in the inspection by said contact angle inspection device.

5. The substrate processing apparatus according to claim 1, wherein
    said first inspection unit includes a film thickness inspection device that inspects the film thickness of said first film formed by said film formation unit, and
    said controller determines that the state of the substrate is not normal when the film thickness of said first film is abnormal in the inspection by said film thickness inspection device.

6. The substrate processing apparatus according to claim 1, wherein said interface further includes
    a second inspection unit that inspects the state of the substrate after the exposure processing by said exposure device.

7. The substrate processing apparatus according to claim 1, wherein said film formation unit forms a photosensitive film composed of a photosensitive material as said first film on the substrate.

8. The substrate processing apparatus according to claim 1, wherein said processing section further includes a photosensitive film formation unit that forms a photosensitive film composed of a photosensitive material as a second film on the main surface of the substrate, and
    said first film formed by said film formation unit is a protective film for protecting said photosensitive film.

9. A substrate processing apparatus arranged adjacent to an exposure device that subjects a substrate to exposure processing using a liquid immersion method, comprising:
    a processing section that subjects the substrate to processing;
    an interface provided adjacent to one end of said processing section for transferring and receiving the substrate between said processing section and said exposure device; and
    an alarm device that generates an alarm to an operator, wherein said processing section includes
    a photosensitive film formation unit that forms a photosensitive film composed of a photosensitive material on the substrate, and
    a development processing unit that subjects said photosensitive film after the exposure processing by said exposure device to development processing, and
    said interface includes
    a first inspection unit that inspects the state of the substrate after the formation of said photosensitive film by said photosensitive film formation unit and before the exposure processing by said exposure device, and
    a second inspection unit that inspects the state of the substrate after the exposure processing by said exposure device and before the development processing by said development processing unit, and
    said alarm device generates the alarm to the operator when the result of the inspection for one substrate in said first inspection unit and the result of the inspection for said one substrate in said second inspection unit differ from each other.

10. The substrate processing apparatus according to claim 9, wherein each of said first and second inspection units includes an appearance inspection device that inspects the appearance of said photosensitive film formed by said photosensitive film formation unit.

11. The substrate processing apparatus according to claim 9, wherein each of said first and second inspection units includes a bevel portion inspection device that inspects a bevel portion in the substrate.

12. The substrate processing apparatus according to claim 9, wherein each of said first and second inspection units includes a component inspection device that inspects a component of said photosensitive film formed by said photosensitive film formation unit.

13. The substrate processing apparatus according to claim 9, wherein each of said first and second inspection units includes a contact angle inspection device that inspects the contact angle of a liquid on said photosensitive film formed by said photosensitive film formation unit.

14. The substrate processing apparatus according to claim 9, wherein each of said first and second inspection units includes a film thickness inspection device that inspects the film thickness of said photosensitive film formed by said photosensitive film formation unit.

15. The substrate processing apparatus according to claim 9, wherein said interface does not transport the substrate that is abnormal in the inspection by said first inspection unit to the exposure device.

16. The substrate processing apparatus according to claim 9, wherein said processing section further includes a protective film formation unit that forms a protective film for protecting said photosensitive film after the formation of said photosensitive film by said photosensitive film formation unit and before the inspection of the state of the substrate by said first inspection unit.

17. The substrate processing apparatus according to claim 16, wherein each of said first and second inspection units includes an appearance inspection device that inspects the appearance of said protective film formed by said protective film formation unit.

18. The substrate processing apparatus according to claim 16, wherein each of said first and second inspection units includes a component inspection device that inspects a component of said protective film formed by said protective film formation unit.

19. The substrate processing apparatus according to claim 16, wherein each of said first and second inspection units includes a contact angle inspection device that inspects the contact angle of a liquid on said protective film formed by said protective film formation unit.

20. The substrate processing apparatus according to claim 16, wherein each of said first and second inspection units includes a film thickness inspection device that inspects the film thickness of said protective film formed by said protective film formation unit.

21. A substrate processing method for processing a substrate in a substrate processing apparatus arranged adjacent to an exposure device that subjects the substrate to exposure processing using a liquid immersion method and comprising a processing section and an interface, the method comprising the steps of:

forming a first film on a main surface of the substrate in said processing section;

subjecting said first film to thermal processing in said processing section;

performing cleaning processing of the main surface of the substrate after the thermal processing and before the exposure processing by said exposure device in one of said processing section and said interface;

inspecting the state of the main surface of the substrate in said interface after the cleaning processing and before the exposure processing by said exposure device;

determining whether or not the state of the substrate is normal based on the results of the inspection;

transporting the substrate that is determined to be normal in the state to said exposure device by said interface; and not transporting the substrate that is determined not to be normal in the state to said exposure device by said interface, wherein the step of inspecting the state of the main surface of the substrate before the exposure processing includes the step of inspecting the appearance of said first film formed by said film formation unit, and the step of determining whether or not the state of the substrate is normal includes the step of determining that the state of the substrate is not normal when the appearance of said first film is abnormal in the step of inspecting the appearance of said first film.

22. A substrate processing method for processing a substrate in a substrate processing apparatus arranged adjacent to an exposure device that subjects the substrate to exposure processing using a liquid immersion method and comprising a processing section and an interface, the method comprising the steps of:

forming a photosensitive film composed of a photosensitive material on the substrate in said processing section;

inspecting the state of the substrate by a first inspection unit in said interface after the formation of said photosensitive film and before the exposure processing by said exposure device;

inspecting the state of the substrate by a second inspection unit in said interface after the exposure processing by said exposure device;

generating an alarm to an operator when the result of the inspection for one substrate in said first inspection unit and the result of the inspection for said one substrate in said second inspection unit differ from each other; and subjecting said photosensitive film on the substrate after the inspection by said second inspection unit to development processing.

* * * * *